(12) United States Patent
Yin

(10) Patent No.: US 6,441,452 B2
(45) Date of Patent: Aug. 27, 2002

(54) METHOD OF REDUCING DEFECTS IN ANTI-REFLECTIVE COATINGS AND SEMICONDUCTOR STRUCTURES FABRICATED THEREBY

(75) Inventor: Zhiping Yin, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/819,872

(22) Filed: Mar. 28, 2001

Related U.S. Application Data

(60) Continuation of application No. 09/538,555, filed on Mar. 29, 2000, now Pat. No. 6,225,671, which is a continuation of application No. 09/271,621, filed on Mar. 17, 1999, now Pat. No. 6,144,083, which is a division of application No. 09/095,477, filed on Jun. 10, 1998.

(51) Int. Cl.⁷ .............................................. H01L 29/72
(52) U.S. Cl. ..................... 257/437; 257/640; 257/649
(58) Field of Search ................................ 257/437, 640, 257/649

(56) References Cited

U.S. PATENT DOCUMENTS

| | | |
|---|---|---|
| 5,006,192 A | 4/1991 | Deguchi |
| 5,378,659 A | 1/1995 | Roman et al. |
| 5,454,903 A | 10/1995 | Redeker et al. |
| 5,539,249 A | 7/1996 | Roman et al. |
| 5,637,190 A | 6/1997 | Liao |
| 5,641,607 A | 6/1997 | Ogawa et al. |
| 5,698,352 A | 12/1997 | Ogawa et al. |
| 5,700,741 A | 12/1997 | Liao |
| 5,733,712 A | 3/1998 | Tanaka et al. |
| 5,817,534 A | 10/1998 | Ye et al. |
| 5,824,375 A * | 10/1998 | Gupta |
| 5,831,321 A | 11/1998 | Nagayama |
| 5,843,239 A | 12/1998 | Shrotriya |
| 6,003,526 A | 12/1999 | Lo et al. |
| 6,037,276 A | 3/2000 | Lin et al. |
| 6,060,397 A | 5/2000 | Seamons et al. |
| 6,067,999 A * | 5/2000 | Hines .......................... 257/347 |
| 6,187,682 B1 | 2/2001 | Denning et al. |

FOREIGN PATENT DOCUMENTS

JP 3-211280 * 9/1991

* cited by examiner

Primary Examiner—Edward Wojciechowicz
(74) Attorney, Agent, or Firm—TraskBritt

(57) ABSTRACT

A method for fabricating a substantially smooth-surfaced anti-reflective coating on a semiconductor device structure including generating a plasma from an inert gas in a process chamber in which the anti-reflective coating is to be deposited. The anti-reflective coating may include silicon, oxygen and nitrogen, and is preferably of the general formula $Si_xO_yN_z$, where x equals 0.40 to 0.65, y equals 0.02 to 0.56 and z equals 0.05 to 0.33. Preferably, x+y+z equals one. The method may also include fabricating a silicon nitride layer over the anti-reflective coating. A semiconductor device which includes a silicon nitride layer over the anti-reflective coating has a density of less than about 40,000 particles or surface roughness features in the silicon nitride of about 120–150 nanometers dimension per eight inch wafer. Accordingly, a mask that is subsequently formed over the silicon nitride layer has a substantially uniform thickness and is substantially distortion-free.

20 Claims, 4 Drawing Sheets

METHOD OF REDUCING DEFECTS IN ANTI-REFLECTIVE COATINGS AND SEMICONDUCTOR STRUCTURES FABRICATED THEREBY

CROSS REFERENCE TO RELATED APPLICATIONS

This application is a continuation of application Ser. No. 09/538,555, filed Mar. 29, 2000, now U.S. Pat. No. 6,225,671 B1, issued May 1, 2001, which is a continuation of application Ser. No. 09/271,621, filed Mar. 17, 1999, now U.S. Pat. No. 6,144,083, which issued on Nov. 7, 2000, which is a divisional of application Ser. No. 09/095,477, filed Jun. 10, 1998, pending.

BACKGROUND OF THE INVENTION

1. Field of the Invention

The present invention relates to a method of disposing an anti-reflective coating (ARC), such as a dielectric anti-reflective coating (DARC), on a semiconductor device structure. Particularly, the present invention relates to a process for reducing the occurrence of particles or roughness on an exposed surface of an ARC or a DARC. More particularly, the present invention relates to a process which reduces the incidence of in-film particles and interfacial irregularities between an ARC or DARC layer and an adjacent, overlying silicon nitride layer.

2. Background of Related Art

Photolithography processes that have been conventionally employed in the manufacture of semiconductor devices typically include disposing a photoresist material over a layer of a semiconductor device structure, such as a wafer or bulk semiconductor material, that is to be patterned, positioning a diffraction grating over the layer of photoresist material, positioning a mask or reticle between the diffraction grating and the layer of photoresist material, and directing electromagnetic radiation, or "light," of some wavelength through openings in the diffraction grating and the mask or reticle in order to "expose" and fix portions of the photoresist beneath the diffraction grating and thereby define an etch mask from the photoresist. Many materials, such as polysilicon, aluminum and metal silicides, that are employed to fabricate structures of semiconductor devices are, however, highly light reflective.

The reflection of light by an underlying layer of material distorts the mask image that is defined from the layer of photoresist material, thereby distorting the structures that are to be defined through the mask image. Exemplary types of photomask distortion that may occur include exposure variations in the thickness of the layer of the photoresist material, which degrade the resolution of the structure to be patterned through the mask and are typically referred to as "standing waves;" pattern dimension variations, or "multiple interferences," caused by variations in the thickness of the layer of photoresist material, which deteriorate the dimensional precision of the structure; and "halation," which is caused by variations in the underlying layer, such as unevenness thereof, which cause light to be reflected into portions of the layer of photoresist material that were intended to be shielded, thereby exposing these portions of the photoresist material layer to light. The magnitude of each of these distortions of the layer of photoresist material depends on the intensity of the light reflected from the underlying layer. As the intensity of reflected light is reduced, the magnitude of standing waves, multiple interferences and halation are also reduced.

Due to the ever-decreasing geometries of state-of-the-art very large scale integration (VLSI) and ultra large scale integration (ULSI) semiconductor devices, and because of the relatively small dimensional tolerances and high dimensional resolution that are desired of the various structures of such devices, techniques have been developed to reduce the intensity of light that is reflected by the layer of material to be patterned.

One type of anti-reflective technique includes the deposition of a film of photoabsorptive material, such as an anti-reflective coating (ARC) or a dielectric anti-reflective coating (DARC), over a layer of material to be patterned by etching prior to disposing a photoresist material over the semiconductor device structure. As portions of the layer of photoresist material are exposed to light, the light passes therethrough and some of the light is absorbed by the ARC or DARC film, thereby reducing the intensity of light that is reflected back into the photoresist, and decreasing the incidence and magnitude of standing waves, multiple interferences, halation, or other distortions of the resultant mask.

An exemplary ARC is a polymer film that may be disposed on the substrate layer by spin-on techniques. Other anti-reflective materials, such as the silicon-rich silicon nitride DARC disclosed in U.S. Pat. No. 5,378,659, which issued to Roman et al. on Jan. 3, 1995; and U.S. Pat. No. 5,539,249, which issued to Roman et al. on Jul. 23, 1996; and the silicon, oxygen and nitrogen DARC materials disclosed in U.S. Pat. No. 5,698,352, which issued to Ogawa et al. on Dec. 16, 1997, may be deposited by known processes, such as chemical vapor deposition (CVD) or plasma-enhanced CVD (PECVD).

The plasmas that are employed to fabricate layers of materials on semiconductor device structures may cause particulate contamination of PECVD process chambers. These contaminant particles may be subsequently disposed upon the surfaces of the exposed layers of a semiconductor device structure that is being processed within the process chamber.

Some PECVD-fabricated DARC films, however, typically have surface roughness features or particles of a size of less than about 120 nanometers (nm) dimension on the surfaces thereof These rough surfaces or particles may act as "seeds" for the growth of larger particles when silicon nitride is subsequently disposed on the DARC film. Thus, when silicon nitride films or structures are subsequently fabricated over PECVD-fabricated DARC films which include silicon, oxygen and nitrogen, seed particles or surface roughness features on the DARC film are known to enhance increased growth of silicon nitride thereover during fabrication of a silicon nitride layer on the DARC film, which may create non-uniformities or particles of about 120–150 nm dimension in the silicon nitride layer, which are referred to as "in-film" particles, at an incidence of about 40,000 or more per eight inch semiconductor wafer. Such in-film particles are undesirable because they may cause structural deformities or other problems in semiconductor device structures of ever-decreasing dimensions.

After such a DARC film has been deposited on a semiconductor device structure and prior to removal of the semiconductor device structure and insertion of one or more subsequent semiconductor device structures into the process chamber, the process chamber is cleaned, which typically includes purging the chamber with an inert gas, such as helium. An undesirable number of particles or surface roughness features which may act as seeds for in-film particles of about 120–150 nm dimension may, however, remain present on DARC films that are fabricated in a chamber cleaned with such a helium purge.

Alternatively, semiconductor wafers or other semiconductor device structures may be heated prior to DARC film fabrication thereon in order to reduce the occurrence of particles or surface roughness of less than about 120 nm. Such preheating, however, is undesirable in that the wafer throughput is limited, thereby raising production costs, as more chambers are required to achieve the same level of throughput that may be achieved without such preheating.

U.S. Pat. No. 5,637,190 (the "'190 patent"), which issued to Liao on Jun. 10, 1997, and U.S. Pat. No. 5,700,741 (the "'741 patent"), which issued to Liao on Dec. 23, 1997, disclose exemplary processes for removing contaminants from a reaction chamber by a plasma-assisted purge. The '741 patent discloses a plasma purge process which includes performing a plasma-assisted process on one or more layers of a semiconductor device structure and employing a radio frequency plasma to polarize and dilute any contaminants that remain in the process chamber while the semiconductor device structure remains in the process chamber, thereby decreasing the likelihood that any contaminant particles will contaminate the semiconductor device structure. The purging radio frequency plasma is generated at a lower power than the previously-employed process plasma in order to polarize any contaminants in the process chamber. The pressure within the process chamber is increased during the purge to dilute any contaminants that remain in the process chamber. The purge gas includes an oxidizing purge gas component, and may also include a non-oxidizing component. Subsequently, the plasma purge may be repeated, but at a lower radio frequency power and an increased process chamber pressure.

The '190 patent discloses a similar process that employs a plasma including both oxidizing and non-oxidizing components. The plasma of the '190 patent, however, chemically and physically etches any contaminants remaining in the process chamber, as well as polarizing and diluting the contaminants. The plasma power and process chamber pressure requirements of the '190 patent are similar to those of the '741 patent.

Although the '190 and '741 patents discuss processes which decrease the amount of contamination in a process chamber following fabrication or definition of silicon oxide layers of a semiconductor device, neither of them disclose use of the purge process to reduce surface roughness or particles on the surface of DARC films that include silicon, oxygen and nitrogen or the formation of in-film particles in a silicon nitride overlayer. Moreover, the processes disclosed in those patents employ oxidizing purge gases, which may not be useful for reducing or eliminating the occurrence of particles or a rough surface on a DARC film that includes silicon, oxygen and nitrogen. Neither the '190 patent nor the '741 patent addresses the removal of contaminants from a process chamber after a deposition operation, removal of the coated semiconductor device structure or other structures and prior to disposing another semiconductor device structure in the process chamber or to fabricating a DARC film thereon by PECVD techniques to reduce or eliminate the incidence of particles or an unduly rough surface on the DARC film.

Thus, a plasma purge process which employs a substantially inert gas is needed to reduce or eliminate the incidence of particles or magnitude of surface roughness features on the surface of PECVD-fabricated DARC films that include silicon, oxygen and nitrogen. A plasma purge process is also needed which may be employed prior to disposing a semiconductor device structure into a PECVD process chamber for processing.

SUMMARY OF THE INVENTION

The present invention addresses the foregoing needs.

The DARC film fabrication method of the present invention includes purging a PECVD process chamber with an inert gas radio frequency plasma (e.g., a helium radio frequency plasma), disposing a semiconductor device structure, such as a silicon, gallium arsenide or indium phosphide wafer, or other semiconductor structures, such as silicon on glass (SOG), silicon on insulator (SOI), or silicon on sapphire (SOS), in the PECVD process chamber and fabricating a DARC film on the semiconductor device structure. Inert gases that are useful in the radio frequency purge plasma include, without limitation, nitrogen (N), those gases that are typically referred to as "noble gases" (e.g., helium (He), argon (Ar), xenon (Xe), etc.), and combinations of inert gases.

The DARC film that is fabricated on the semiconductor device structure preferably includes silicon, nitrogen, and oxygen, and is deposited onto the semiconductor device structure by known PECVD processes. The DARC film may also include hydrogen. Following the fabrication of the DARC film, the semiconductor device structure may be removed from the PECVD process chamber. The radio frequency plasma purge process of the present invention is then conducted prior to fabricating a DARC film on one or more other semiconductor device structures to be subsequently inserted in the chamber. Alternatively, the inventive inert gas radio frequency plasma purge process may be employed after the DARC film has been deposited onto the surface of the semiconductor device structure and prior to removal of the semiconductor device structure from the process chamber. The inventive inert gas radio frequency plasma purge process may also be employed during deposition of a DARC film on the semiconductor device structure. A DARC film that is fabricated in accordance with the inventive method has a smooth surface relative to conventionally fabricated DARC films that include silicon, oxygen and nitrogen, and has a reduced number or is substantially free of small (e.g., sub-120 nm) particles or surface roughness features.

After a DARC film has been fabricated on a semiconductor device structure in accordance with the inventive method, and the semiconductor device structure removed from the PECVD process chamber, a silicon nitride ($Si_3N_4$) layer or structure may be fabricated over the DARC film by processes that are known in the art. Due to the reduction in the amount or size of surface roughness features or particles on a silicon, oxygen and nitrogen-including DARC film that is fabricated in accordance with the present invention, fewer or smaller particles are formed in the silicon nitride layer than those formed in many conventionally-fabricated silicon nitride layers that overlie DARC films. Thus, significantly less "seeding," which may result in the formation of undesirably large quantities or magnitudes of in-film particles and non-uniformities on the surface of the layer of the silicon nitride, occurs. Accordingly, a semiconductor device structure including silicon nitride that is disposed upon a DARC that includes silicon, oxygen and nitrogen, and has an imperfection density of less than about 40,000 particles of about 120–150 nm dimension per eight inch diameter semiconductor wafer is also within the scope of the present invention. The semiconductor device structure of the present invention may be substantially free of such in-film particles.

The DARC film fabrication method of the present invention may also include disposing a photoresist over the silicon nitride layer, disposing a diffraction grating between the semiconductor device structure and an electromagnetic radiation source, and directing electromagnetic radiation of a specified wavelength range through the diffraction grating to expose selected areas of the photoresist in order to define a mask therefrom. As is known in the art, the silicon nitride layer and DARC film absorb a significant amount of the electromagnetic radiation (light) that passes through the photoresist. Some of the electromagnetic radiation is, however, reflected back into the photoresist. Accordingly, the reduction or elimination of in-film particles reduces the reflection of electromagnetic radiation in a non-perpendicular direction to the surface of the silicon nitride layer and, consequently, reduces the exposure of shielded areas of the photoresist to the electromagnetic radiation, which may also decrease the degree of distortion in the resultant mask. Thus, a semiconductor device structure including a mask, which has a substantially uniform thickness and openings of substantially desired dimensions and resolution, that is disposed over silicon nitride that overlies a DARC including silicon and nitrogen is also within the scope of the present invention.

The present invention also includes a process for reducing or eliminating contaminants from a process chamber in which a plasma may be generated, such as a PECVD chamber, a plasma-assisted etch chamber, other types of CVD chambers, or other chambers in which plasma-assisted semiconductor device fabrication associated processes are performed. The process for reducing or eliminating contaminants includes generating radio frequency plasma of inert gas or mixture of inert gases in the process chamber prior to conducting a plasma-assisted process therein.

Other advantages of the present invention will become apparent to those of skill in the art through a consideration of the ensuing description, the accompanying drawings, and the appended claims.

DETAILED DESCRIPTION OF THE INVENTION

Figure 1A:
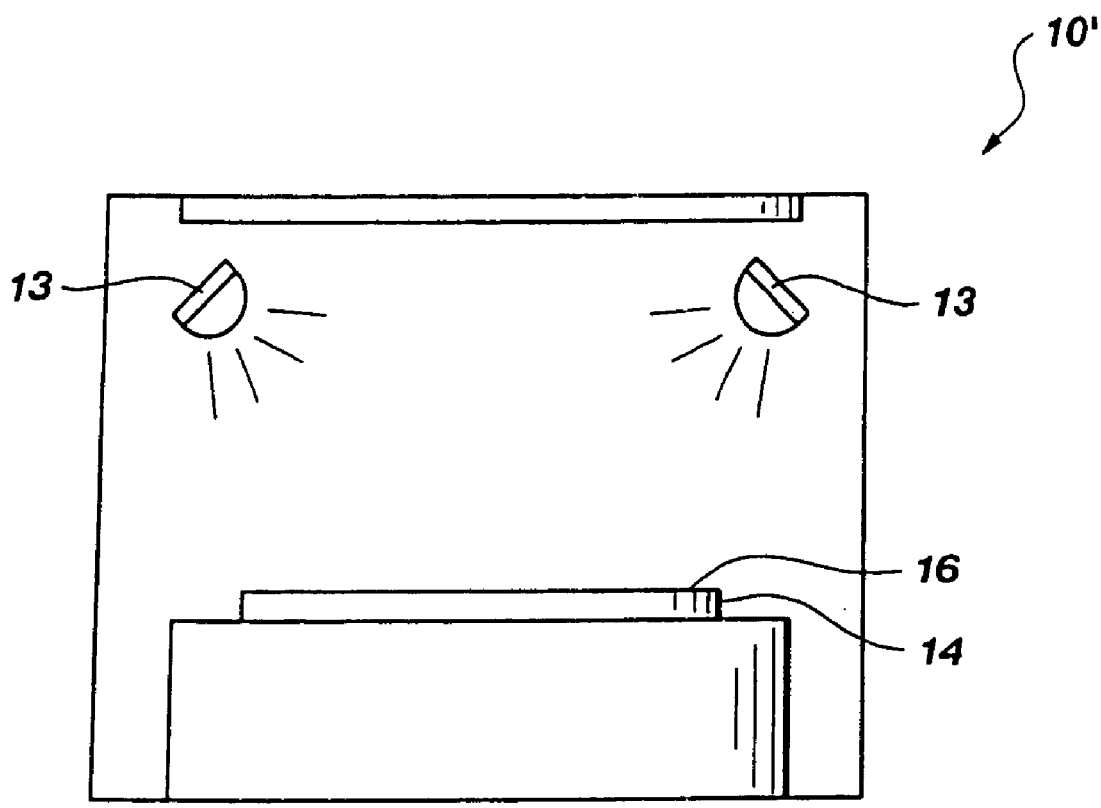
FIG. 1a is a schematic representation of another PECVD process chamber in which a DARC film may be fabricated upon a semiconductor device structure.
Figure 1:
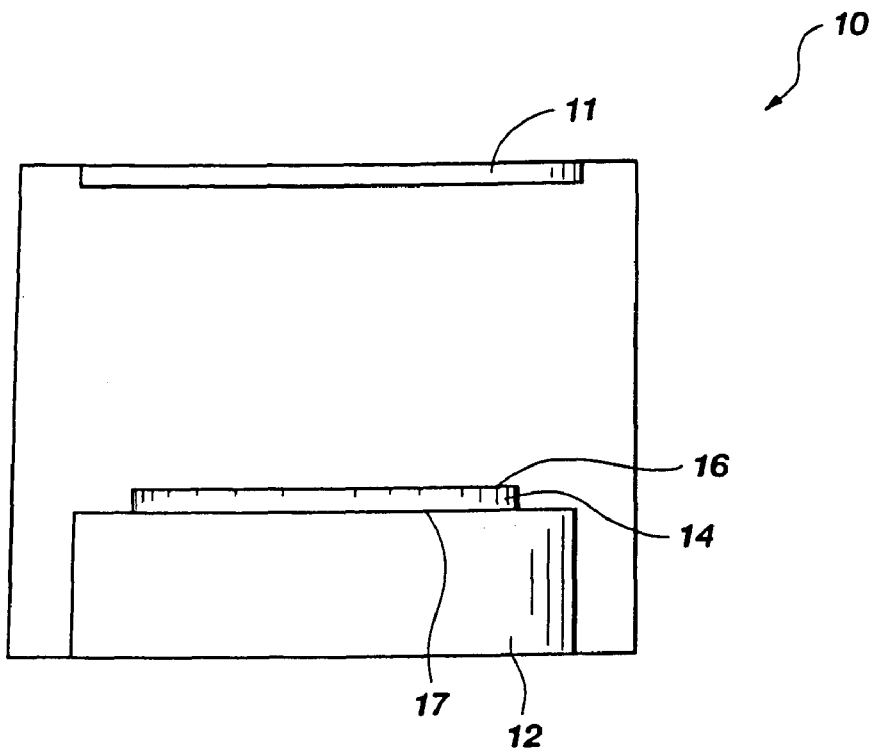
FIG. 1 is a schematic representation of a PECVD process chamber in which a DARC film may be fabricated upon a semiconductor device structure.

With reference to FIG. 1, a process chamber 10 of a PECVD reactor is illustrated, in which a DARC film including silicon, oxygen and nitrogen is deposited upon a semiconductor device structure. PECVD process chamber 10 includes a source 11 and a wafer support 12, which is also referred to as a susceptor. Preferably, wafer support 12 heats a wafer or other semiconductor device structure 14 disposed thereon from beneath by electrical resistance. Stated another way, an active surface 16 of semiconductor device structure 14, upon which material layers or structures (e.g., DARC films) will be deposited, is heated through the semiconductor device structure by wafer support 12. Exemplary electrical resistance-heated PECVD process chambers in which the DARC film fabrication method and the radio frequency plasma purge process of the present invention may be conducted include, without limitation, the process chamber of a Price DX2 PECVD reactor and the process chambers of other single-wafer and parallel plate electrical resistance-heated PECVD reactors known in the art. Alternatively, with reference to FIG. 1a, PECVD process chamber 10' may include a lamp 13, such as a halogen heat-generating lamp, which heats an active surface 16 of a semiconductor device structure 14 from above.

Figure 2:
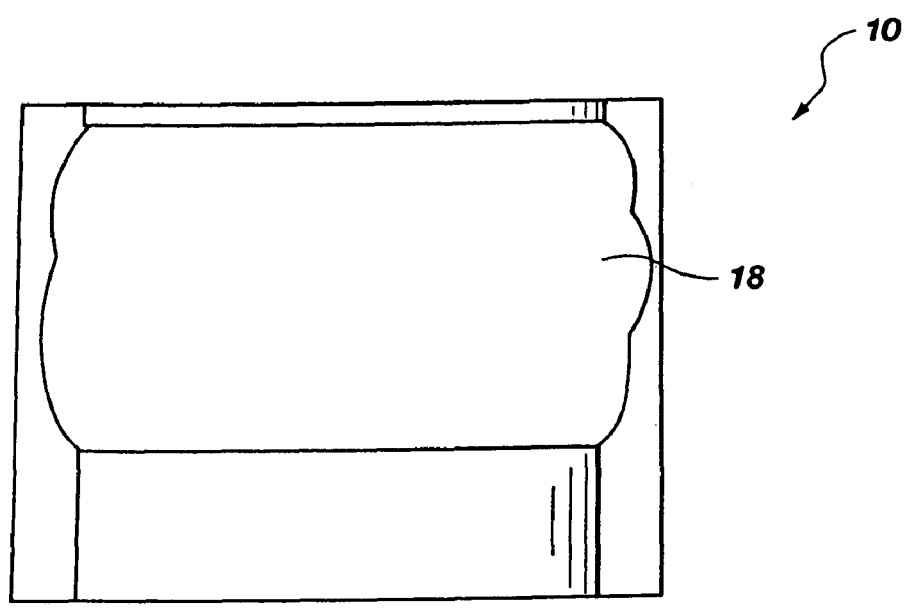
FIG. 2 is a schematic representation of a PECVD process chamber, illustrating the radio frequency plasma purge process of the present invention.

Referring now to FIG. 2, the radio frequency plasma purge process of the present invention is schematically illustrated. Prior to positioning any semiconductor device structures 14 (see FIG. 1) into PECVD process chamber 10, a radio frequency purge plasma 18 is generated within the PECVD process chamber 10 to remove any residual DARC materials or other contaminants therefrom. Radio frequency purge plasma 18 comprises a plasma generated from an inert gas, such as nitrogen, a so-called "noble gas" (e.g., He, Ar, Xe, etc.), or any combination of inert gases. Radio frequency purge plasma 18 preferably comprises a helium plasma.

With reference again to FIG. 1, semiconductor device structure 14 is positioned within PECVD process chamber 10 with a back side 17 of semiconductor device structure 14 positioned adjacent wafer support 12, and active surface 16 facing source 11 of the process chamber. In this orientation, known reactants may be introduced into PECVD process chamber 10 to form a DARC film that includes silicon, oxygen and nitrogen upon active surface 16 of semiconductor device structure 14.

Figure 3:
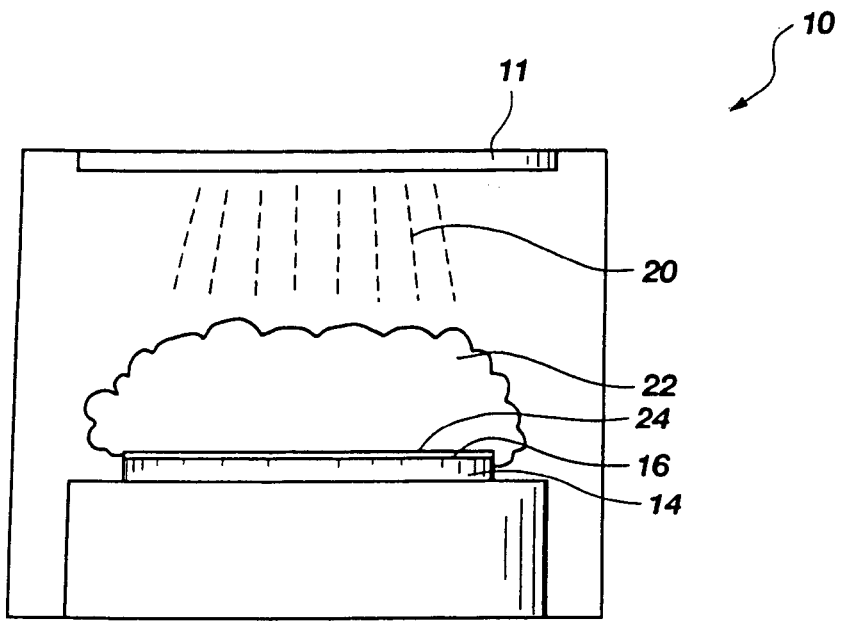
FIG. 3 is a schematic representation of DARC film fabrication upon a semiconductor device structure in accordance with the present invention.

Turning to FIG. 3, reactants 20 are introduced into PECVD process chamber 10 and a radio frequency reactant plasma 22 is generated between source 11 and active surface 16 in order to effect the deposition of a DARC film 24 on active surface 16. When the material of DARC film 24 comprises $Si_xO_yN_z$, where x equals 0.40 to 0.65, y equals 0.02 to 0.56 and z equals 0.05 to 0.33, known reactants, such as a mixture of $SiH_4$, $N_2O$ and He or a mixture of $SiH_4$, $O_2$ and $N_2$, may be employed. Preferably, x+y+z equals one. The material of DARC film 24 may also include hydrogen. An exemplary DARC film 24 may have the general formula $Si_{0.50}O_{0.37}N_{0.13}$:H. A buffer gas such as Ar may also be introduced into PECVD process chamber 10 with reactants 20. Preferably, known process parameters, including, without limitation, the relative amounts of each of reactants 20 and any buffer gases, the process chamber pressure and temperature, and the amount of power that is employed to generate radio frequency reactant plasma 22, are employed to fabricate DARC film 24.

Referring again to FIG. 2, an inert gas radio frequency purge plasma 18 is generated in PECVD process chamber 10 following the deposition of a DARC film 24 upon a semiconductor device structure 14 (see FIG. 3), and preferably prior to the insertion of another semiconductor device structure into the process chamber. Preferably, purge plasma 18 is generated after a semiconductor device structure 14 carrying a DARC film 24 has been removed from PECVD process chamber 10. Purge plasma 18 may, however, be generated while DARC film 24-carrying semiconductor device structure 14 remains in PECVD process chamber 10. Purge plasma 18 may also be generated during the fabrication of DARC film 24 on semiconductor device structure 14. Alternatively, purge plasma 18 may be generated after another semiconductor device structure has been placed in PECVD process chamber 10, and prior to the deposition of a DARC film thereon.

Figure 4:
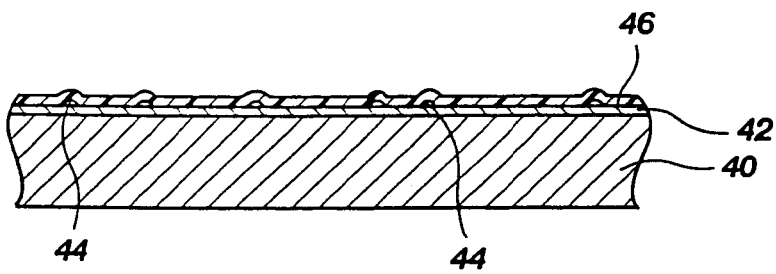
FIG. 4 is a cross section of a semiconductor device which includes a conventionally fabricated DARC film thereon, a silicon nitride layer over the DARC film, and infilm particles between the DARC film and silicon nitride layer.

FIG. 4 illustrates a semiconductor device structure 40 which carries a conventionally deposited DARC film 42 of $Si_xO_yN_z$:H and a silicon nitride layer 46 disposed upon the DARC film 42. The semiconductor device structure 40 of FIG. 4 includes "particles" or surface roughness features on DARC film 42, which act as seeds for particles that form in silicon nitride layer 46, which are also referred to as in-film particles 44. As discussed previously, in-film particles 44 typically have a size of about 120–150 nm and a density on semiconductor device structure 40 of about 40,000 or more per eight inch diameter wafer.

Figure 5:
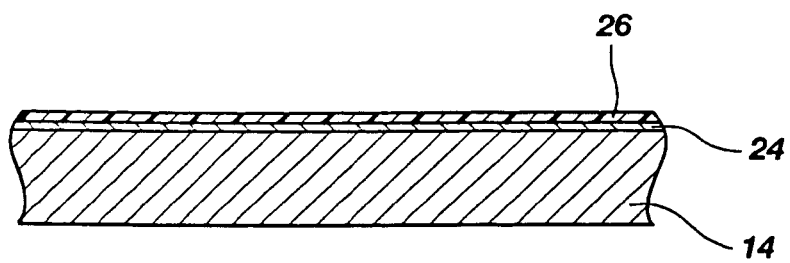
FIG. 5 is a cross section of a semiconductor device which has been fabricated in accordance with the method of the present invention, and which is substantially free of in-film particles between the silicon nitride layer and DARC film thereof.

In contrast, FIG. 5 illustrates a semiconductor device structure 14 of the present invention, which includes a silicon nitride layer 26, which is also referred to as an "overlayer," that is fabricated on DARC film 24 by known processes, such as LPCVD, CVD or PECVD processes. As FIG. 5 depicts, the number of about 120–150 nm dimension particles in silicon nitride layer 26 is substantially reduced. Silicon nitride layer 26 may be substantially free of particles or surface roughness features in the about 120–150 nm size range.

Figure 6:
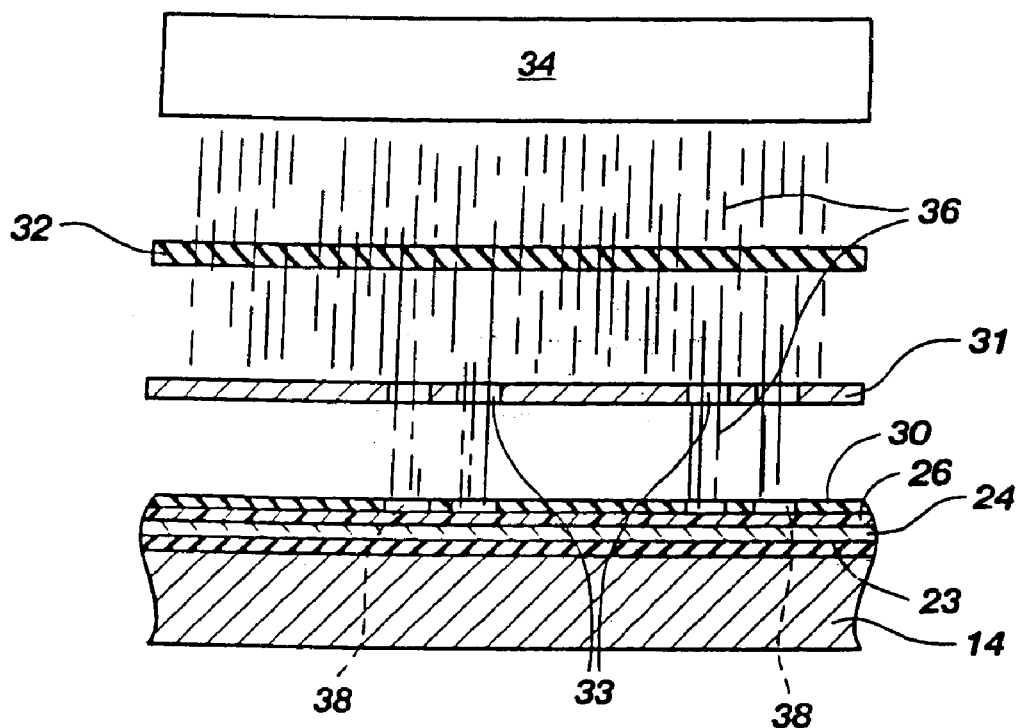
FIG. 6 is a schematic representation of a process for forming a mask, which may be employed over a semiconductor device structure that includes a DARC film that has been deposited in accordance with the method of the present invention.

Referring now to FIG. 6, in order to pattern a structure from a material layer 23 of semiconductor device structure 14 that underlies DARC film 24, a mask 28 (see FIG. 7) may be formed over silicon nitride layer 26 by known techniques. For example, known photoresist material 30 may be disposed over silicon nitride layer 26 by a known technique, such as spin-on processes. Exemplary photoresist materials 30 include positive photoresists, such as those that include a novolac resin, a diazonaphthaquinone, and a solvent (e.g., n-butyl alcohol or xylene), and negative photoresist materials, such as those that include a cyclized synthetic rubber resin, bis-arylazide, and an aromatic solvent.

A diffraction grating 32 is then disposed between photoresist material 30 and an electromagnetic radiation source 34. A reticle 31 or mask is disposed between diffraction grating 32 and the layer of photoresist material 30. Electromagnetic radiation 36, or light, of a specified wavelength range is emitted from source 34 and directed toward and through diffraction grating 32, toward reticle 31, and through transparent portions, or "openings" 33, of reticle 31 to certain exposed regions 38 of photoresist material 30. Preferably, electromagnetic radiation 36 is directed substantially perpendicularly to the surface of silicon nitride layer 26.

Figure 7:
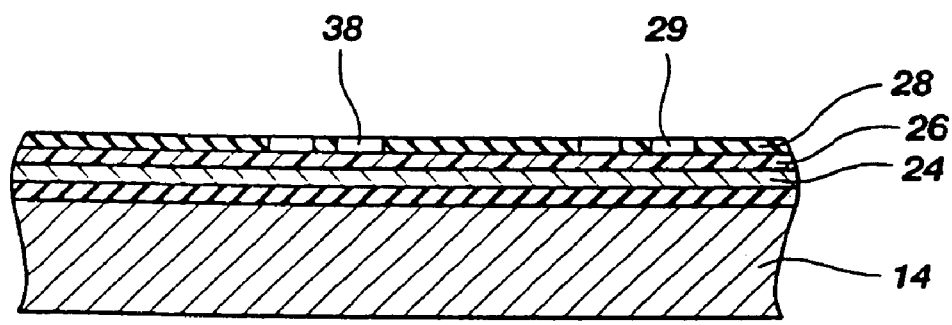
FIG. 7 is a cross section of the semiconductor device of FIG. 5, including a mask over the silicon nitride layer thereof.

Referring now to FIG. 7, as is known in the art, as regions 38 are exposed to electromagnetic radiation 36, various features 29 of mask 28 are defined. Due to the substantial reduction in the number or size of particles and surface roughness features in silicon nitride layer 26, the silicon nitride layer has a substantially smooth surface, and any electromagnetic radiation 36 that is reflected by silicon nitride layer 26 or DARC film 24 passes back into photoresist material 30 in a direction substantially perpendicular to the surface of silicon nitride layer 26. Accordingly, features 29 of mask 28 have substantially the desired dimensions and resolution. Moreover, the thickness of mask 28 is substantially uniform.

Silicon nitride layer 26 may then be patterned by known processes, such as anisotropic or isotropic etching, to form a hard mask therefrom. DARC film 24 and one or more layers 23 of semiconductor device structure 14 that underlie DARC film 24 may then be patterned by known processes to define semiconductor device features of substantially desired dimensions and resolution therefrom. Alternatively, silicon nitride layer 26, DARC film 24, and one or more layers 23 of semiconductor device structure 14 that underlie DARC film 24 may be patterned through mask 28 at the same time by known processes to define semiconductor device features of substantially desired dimensions and resolution therefrom.

With reference again to FIG. 3, other processes for depositing a DARC film 24 of $Si_xO_yN_z$:H upon a semiconductor device structure 14 that are known in the art, such as CVD, electron cyclotron resonance (ECR) PECVD, and bias ECR PECVD processes, may also be employed in accordance with the DARC film fabrication method of the present invention. Similarly, the inert gas radio frequency plasma purge process of the present invention may be employed to remove contaminants from the process chambers of other types of reactors, such as CVD, ECR PECVD, and bias ECR PECVD reactors.

Although the foregoing description includes many specifics, these should not be construed as limiting the scope of the present invention, but merely as providing illustrations of some of the presently preferred embodiments. Similarly, other embodiments of the invention may also be devised which do not depart from the spirit or scope of the present invention. The scope of the present invention is, therefore, indicated and limited only by the appended claims and their legal equivalents, rather than by the foregoing description. All additions, deletions and modifications to the invention as disclosed herein which fall within the meaning and scope of the claims are to be embraced thereby.

What is claimed is:

1. A semiconductor device structure, comprising:
   a first layer comprising anti-reflective material; and
   a second layer comprising silicon nitride, located over said first layer, and including surface roughness features of less than about 120 nanometers.

2. The semiconductor device structure of claim 1, wherein said anti-reflective material comprises silicon atoms and nitrogen atoms.

3. The semiconductor device structure of claim 2, wherein said anti-reflective material further comprises oxygen atoms.

4. The semiconductor device structure of claim 1, wherein said anti-reflective material comprises $Si_xO_yN_z$, where x equals about 0.40 to about 0.65 times the sum of x, y, and z, y equals about 0.02 to about 0.56 times the sum of x, y, and z, and z equals about 0.05 to about 0.33 times the sum of x, y, and z.

5. The semiconductor device structure of claim 1, wherein a surface of said first layer is substantially free of at least one of measurable particulates and surface roughness.

6. The semiconductor device structure of claim 1, wherein said second layer includes less than about 40,000 of at least one of particles and surface roughness features of at least about 120 nm dimension in an area equivalent to a surface of an 8 inch diameter wafer.

7. The semiconductor device structure of claim 1, wherein said second layer is formed on said first layer.

8. A semiconductor device structure, comprising:

a first layer comprising anti-reflective material; and a second layer comprising silicon nitride, located over said first layer, and including a density of less than about 40,000 particles or surface roughness features of at least about 120 nanometers size in an area approximately equivalent to a surface area of an 8 inch diameter wafer.

9. The semiconductor device structure of claim 8, wherein said anti-reflective material comprises silicon atoms and nitrogen atoms.

10. The semiconductor device structure of claim 9, wherein said anti-reflective material further comprises oxygen atoms.

11. The semiconductor device structure of claim 8, wherein said anti-reflective material comprises $Si_xO_yN_z$, where x equals about 0.40 to about 0.65 times the sum of x, y, and z, y equals about 0.02 to about 0.56 times the sum of x, y, and z, and z equals about 0.05 to about 0.33 times the sum of x, y, and z.

12. The semiconductor device structure of claim 8, wherein said second layer is formed on said first layer.

13. A semiconductor device structure, comprising:

a first layer comprising anti-reflective material;

a second layer comprising silicon nitride, located over said first layer, and including less than about 40,000 particles or surface roughness features of at least about 120 nanometers size in an area approximately equivalent to a surface area of an 8 inch diameter wafer; and a mask layer having a substantially uniform thickness formed over said second layer.

14. The semiconductor device structure of claim 13, wherein said first layer has a substantially smooth surface.

15. The semiconductor device structure of claim 13, wherein said anti-reflective material comprises silicon atoms and nitrogen atoms.

16. The semiconductor device structure of claim 15, wherein said anti-reflective material further comprises oxygen atoms.

17. The semiconductor device structure of claim 13, wherein said anti-reflective material comprises $Si_xO_yN_z$, where x equals about 0.40 to about 0.65 times the sum of x, y, and z, y equals about 0.02 to about 0.56 times the sum of x, y, and z, and z equals about 0.05 to about 0.33 times the sum of x, y, and z.

18. The semiconductor device structure of claim 13, wherein said second layer is disposed between said first layer and said mask layer.

19. The semiconductor device structure of claim 13, wherein said second layer is formed on said first layer.

20. The semiconductor device structure of claim 13, wherein said mask layer is formed on said second layer.

* * * * *